(12) United States Patent
Lyon

(10) Patent No.: US 11,515,696 B2
(45) Date of Patent: Nov. 29, 2022

(54) ELECTRICAL COMPONENT ENCLOSURE WITH INJECTED SEAL AND METHOD

(71) Applicant: TE Connectivity Services GmbH, Schaffhausen (CH)

(72) Inventor: Zachary Wood Lyon, Lewisville, NC (US)

(73) Assignee: TE Connectivity Solutions GmbH

( * ) Notice: Subject to any disclaimer, the term of this patent is extended or adjusted under 35 U.S.C. 154(b) by 328 days.

(21) Appl. No.: 16/716,572

(22) Filed: Dec. 17, 2019

(65) Prior Publication Data

US 2021/0184448 A1 Jun. 17, 2021

(51) Int. Cl.
*H02G 15/10* (2006.01)
*H01R 4/64* (2006.01)
*H01R 13/52* (2006.01)
*H02G 15/18* (2006.01)
*H01R 4/70* (2006.01)

(52) U.S. Cl.
CPC ............ *H02G 15/10* (2013.01); *H01R 4/646* (2013.01); *H01R 4/70* (2013.01); *H01R 13/5216* (2013.01); *H02G 15/18* (2013.01)

(58) Field of Classification Search
None
See application file for complete search history.

(56) References Cited

U.S. PATENT DOCUMENTS

| | | | | |
|---|---|---|---|---|
| 1,635,749 A | * | 7/1927 | Hosmer ................. | E21B 33/06 166/85.4 |
| 3,138,657 A | * | 6/1964 | Wengen ................. | H02G 15/18 174/76 |
| 3,147,338 A | * | 9/1964 | Ekvall ..................... | H01R 4/38 174/92 |
| 3,183,302 A | * | 5/1965 | Wochner ................. | H01R 4/20 174/92 |

(Continued)

FOREIGN PATENT DOCUMENTS

| | | | | |
|---|---|---|---|---|
| CN | 1081045 A | * | 1/1994 | ......... H01R 13/5216 |
| CN | 1088716 A | * | 6/1994 | ......... H01R 13/5825 |

(Continued)

OTHER PUBLICATIONS

Wong. Polymer for Electronic Packaging in the 21st Century. 2000. Applied Polymer Science: 21st Century. p. 659, 665-666 (Year: 2000).*

*Primary Examiner* — Timothy J. Dole
*Assistant Examiner* — Muhammed Azam

(57) ABSTRACT

An enclosure and method for an electrical component having a base portion and a cover portion. The base portion has a first channel which extends about at least a portion of a periphery of the base portion. The cover portion has a second channel which extends about at least a portion of a periphery of the cover portion. The second channel is aligned with the first channel to form a sealant receiving channel. A sealant is provided in the sealant receiving channel. The cover portion has at least one inlet opening configured to receive (Continued)

the sealant as the sealant is injected into the sealant receiving channel. The cover portion has at least one outlet opening configured to allow excess sealant of the sealant to escape from the sealant receiving channel as the sealant is injected into the sealant receiving channel.

14 Claims, 4 Drawing Sheets

(56) References Cited

U.S. PATENT DOCUMENTS

| | | | | |
|---|---|---|---|---|
| 3,344,393 | A * | 9/1967 | Hendee | H01R 13/6392 439/367 |
| 3,410,950 | A * | 11/1968 | Freudenberg | H01R 4/206 439/423 |
| 3,484,541 | A * | 12/1969 | Campbell | H02G 15/18 174/92 |
| 3,666,134 | A * | 5/1972 | Rauch | H05K 7/1427 292/256.75 |
| 3,715,459 | A * | 2/1973 | Hoffman | H02G 15/113 174/76 |
| 3,875,325 | A * | 4/1975 | Anderson | H02G 15/117 174/76 |
| 3,923,362 | A * | 12/1975 | Dunn | H01R 4/2433 439/409 |
| 4,435,034 | A * | 3/1984 | Aujla | H01R 4/2433 439/404 |
| 4,662,692 | A * | 5/1987 | Uken | H01R 13/5216 439/271 |
| 4,736,071 | A * | 4/1988 | Hawkins | H02G 15/10 174/91 |
| 4,849,580 | A * | 7/1989 | Reuter | H01R 13/5216 174/76 |
| 4,963,700 | A * | 10/1990 | Olsen | H02G 15/18 174/92 |
| 5,397,859 | A * | 3/1995 | Robertson | H02G 15/113 174/92 |
| 5,525,073 | A * | 6/1996 | Sampson | H02G 15/18 439/358 |
| 5,569,882 | A * | 10/1996 | Yokoyama | H02G 15/003 174/76 |
| 5,606,150 | A * | 2/1997 | Radliff | H02G 15/113 174/92 |
| 5,844,171 | A * | 12/1998 | Fitzgerald | H02G 15/113 174/92 |
| 6,002,088 | A * | 12/1999 | Ehmann | H02G 15/013 174/152 G |
| 6,652,312 | B2 * | 11/2003 | Liegl | H01R 13/5216 174/76 |
| 6,955,558 | B1 * | 10/2005 | Low | H02G 15/18 439/587 |
| 7,037,128 | B2 * | 5/2006 | Yaworski | H01R 4/36 174/88 B |
| 7,075,013 | B1 * | 7/2006 | Rebers | H02G 7/08 174/92 |
| 7,141,738 | B2 * | 11/2006 | Marsac | H02G 15/113 174/92 |
| 7,432,445 | B2 * | 10/2008 | Bird | H02G 15/113 174/92 |
| 7,464,728 | B2 * | 12/2008 | Cairns | F16L 55/17 138/155 |
| RE45,951 | E * | 3/2016 | Mullaney | G02B 6/4477 |
| 9,474,170 | B2 * | 10/2016 | Kim | B60R 16/0235 |
| 9,608,361 | B2 * | 3/2017 | Vaccaro | H01R 13/5205 |
| 9,774,132 | B2 * | 9/2017 | Lindkamp | H01R 13/5205 |
| 9,905,957 | B1 * | 2/2018 | Baldwin | H01R 4/489 |
| 9,949,394 | B2 * | 4/2018 | Kamoshida | H05K 5/0082 |
| 9,971,120 | B2 * | 5/2018 | Rudenick | G02B 6/4452 |
| 10,007,080 | B2 * | 6/2018 | Burkett | G02B 6/4471 |
| 10,125,900 | B2 * | 11/2018 | Penrod | F16L 5/10 |
| 10,189,422 | B2 * | 1/2019 | Adachi | H01R 4/70 |
| 10,630,150 | B2 * | 4/2020 | Tsuboi | H02K 5/10 |
| 10,840,615 | B2 * | 11/2020 | Newman | H01R 4/2408 |
| 11,139,613 | B2 * | 10/2021 | Masumoto | H01R 13/5216 |
| 2004/0075989 | A1 * | 4/2004 | Wong | B29C 45/14467 361/752 |
| 2010/0038130 | A1 * | 2/2010 | Zhong | H02G 15/113 174/520 |
| 2013/0120943 | A1 * | 5/2013 | Tamura | H05K 5/062 361/752 |
| 2016/0249465 | A1 * | 8/2016 | Schmidt | F16H 61/0006 |
| 2018/0252887 | A1 * | 9/2018 | Coenegracht | G02B 6/445 |
| 2018/0317282 | A1 * | 11/2018 | Rogers | B60R 16/0222 |
| 2019/0002730 | A1 * | 1/2019 | Busby | B05B 7/2472 |
| 2021/0184448 | A1 * | 6/2021 | Lyon | H01R 4/70 |

FOREIGN PATENT DOCUMENTS

| | | | | |
|---|---|---|---|---|
| GB | 2269485 | A * | 2/1994 | H01R 13/5213 |
| JP | 3081775 | B2 * | 8/2000 | H01R 4/70 |
| KR | 0177517 | B1 * | 5/1999 | |
| WO | WO-9208256 | A1 * | 5/1992 | H01R 4/2429 |
| WO | WO-9602078 | A1 * | 1/1996 | H02G 15/013 |
| WO | WO-9613886 | A1 * | 5/1996 | H01R 13/5208 |
| WO | WO-9716869 | A1 * | 5/1997 | G02B 6/4446 |
| WO | WO-2006075131 | A1 * | 7/2006 | H02G 15/013 |
| WO | WO-2018048910 | A2 * | 3/2018 | G02B 6/4444 |

* cited by examiner

ELECTRICAL COMPONENT ENCLOSURE WITH INJECTED SEAL AND METHOD

FIELD OF THE INVENTION

The present invention is directed an enclosure with an injected seal for use with an electrical component and method. In particular, the invention is directed to an enclosure with channels to accept the injected seal which is highly compliant and serviceable.

BACKGROUND OF THE INVENTION

Sealed connectors or covers are used in many applications to protect the electrical terminals and electrical connections from undesirable or harsh environmental or occupational conditions. Many such connectors or covers use known silicone seals, of for example, 40-60 durometers, which are sensitive to positional and part tolerance variations. Consequently, manufacturing tolerances of the connector or covers must be precisely maintained, adding to the cost of production. In addition, if each connector or cover has multiple configurations, for example different points of exit for the wires or cable, different seals may need to be manufactured to accommodate a proper seal being made.

It would, therefore, be beneficial to provide an enclosure which has a channel design in which a highly compliant seal is injected to accommodate various different conductor configurations and positional irregularities.

SUMMARY OF THE INVENTION

An embodiment is directed to an enclosure for an electrical component having a base portion and a cover portion. The base portion has a first channel which extends about at least a portion of a periphery of the base portion. The cover portion has a second channel which extends about at least a portion of a periphery of the cover portion. The second channel is aligned with the first channel to form a sealant receiving channel. A sealant is provided in the sealant receiving channel. The cover portion has at least one inlet opening, the inlet opening extends from a top surface of the cover portion to the second channel of the cover. The inlet opening is configured to receive the sealant as the sealant is injected into the sealant receiving channel. The cover portion has at least one outlet opening, the outlet opening is spaced from the inlet opening and extends from a top surface of the cover portion to the second channel of the cover portion. The outlet opening is configured to allow excess sealant of the sealant to escape from the sealant receiving channel as the sealant is injected into the sealant receiving channel.

An embodiment is directed to a method of providing a sealant to an enclosure. The method comprising: mating a base portion of the enclosure with a cover portion of the enclosure, the base portion having a first channel and the cover portion having a second channel, the first channel and the second channel forming a sealant receiving channel; injecting sealant through at least one inlet opening in the cover into the sealant receiving channel; flowing the sealant from the at least one inlet opening through the sealant receiving channel to at least one outlet opening; and flowing excess sealant from the at least one outlet opening.

Other features and advantages of the present invention will be apparent from the following more detailed description of the preferred embodiment, taken in conjunction with the accompanying drawings which illustrate, by way of example, the principles of the invention.

DETAILED DESCRIPTION OF THE INVENTION

Figure 1:
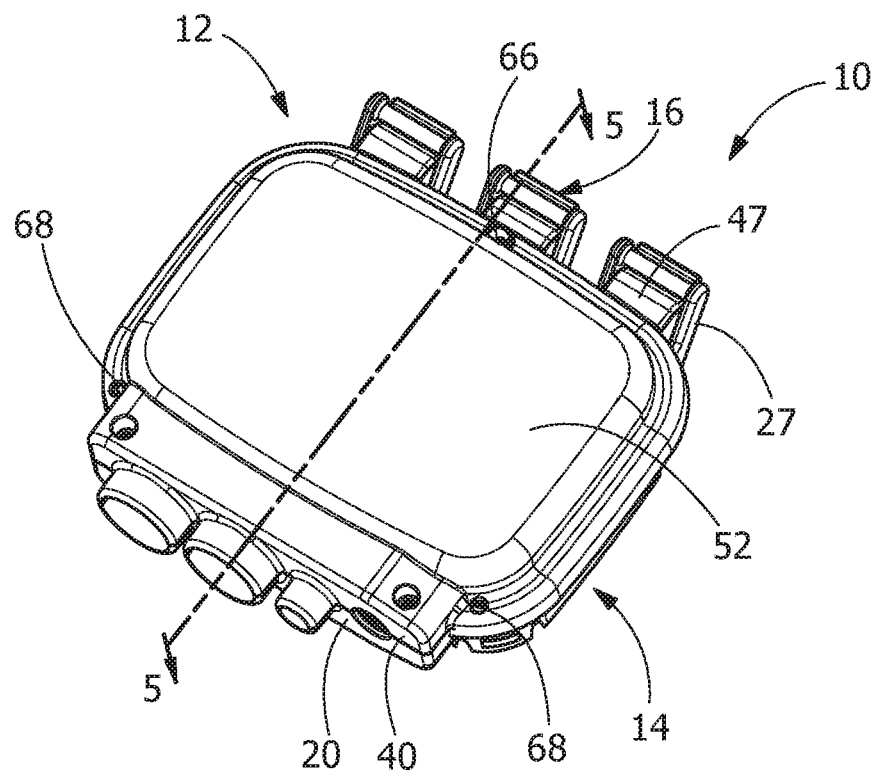
FIG. 1 is a top perspective of an illustrative embodiment of an enclosure device of the present invention.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise.

Moreover, the features and benefits of the invention are illustrated by reference to the preferred embodiments. Accordingly, the invention expressly should not be limited to such embodiments illustrating some possible non-limiting combination of features that may exist alone or in other combinations of features, the scope of the invention being defined by the claims appended hereto.

Figure 2:
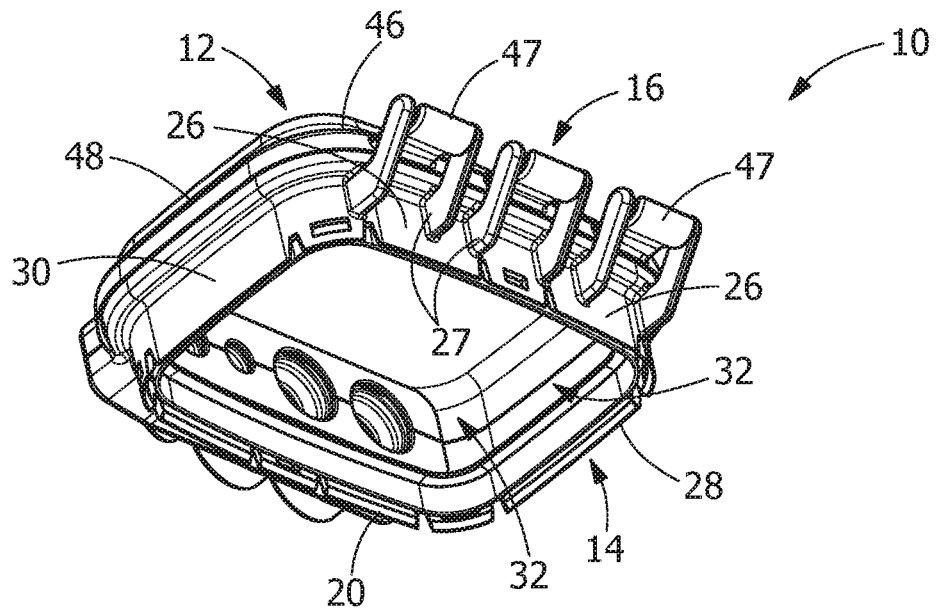
FIG. 2 is a bottom perspective of the enclosure device of FIG. 1.
Figure 3:
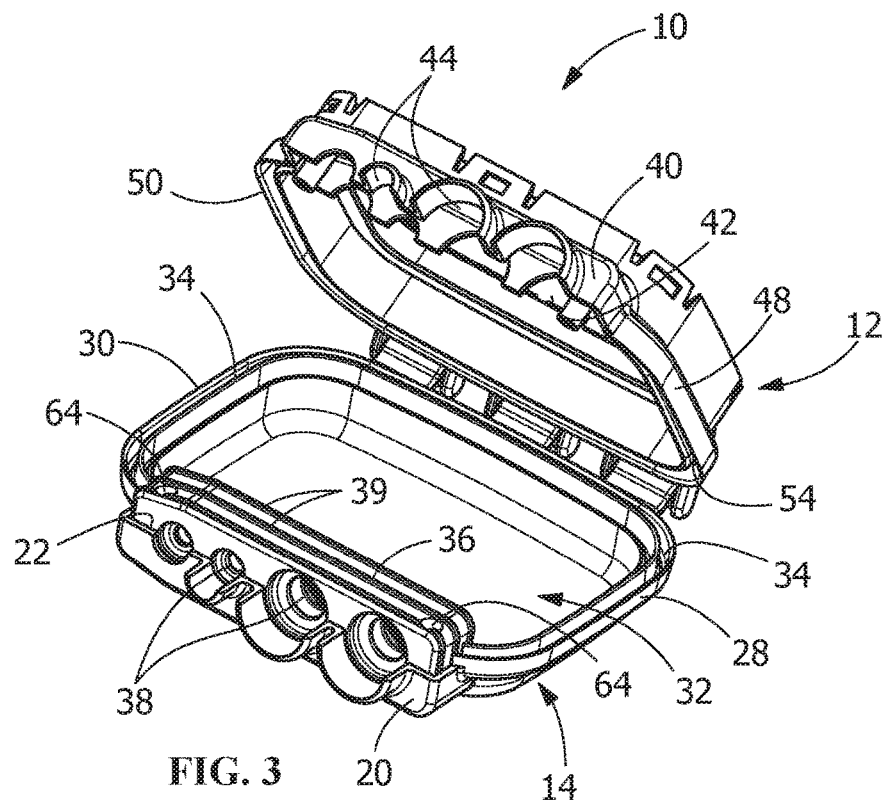
FIG. 3 is a perspective view of the enclosure device of FIG. 1 with a cover portion open relative to a base portion.

As shown in FIGS. 1-3, a cover or enclosure device 10 for use with an electrical component has a cover portion 12 and a base portion 14. In the illustrative embodiment shown, a hinge portion 16 is provided to allow the cover portion 12 to move between an open position and a closed position relative to the base portion 14. The enclosure device 10 is positioned on an electrical component (not shown) to provide a sealed entrance for wires or cables.

Figure 4:
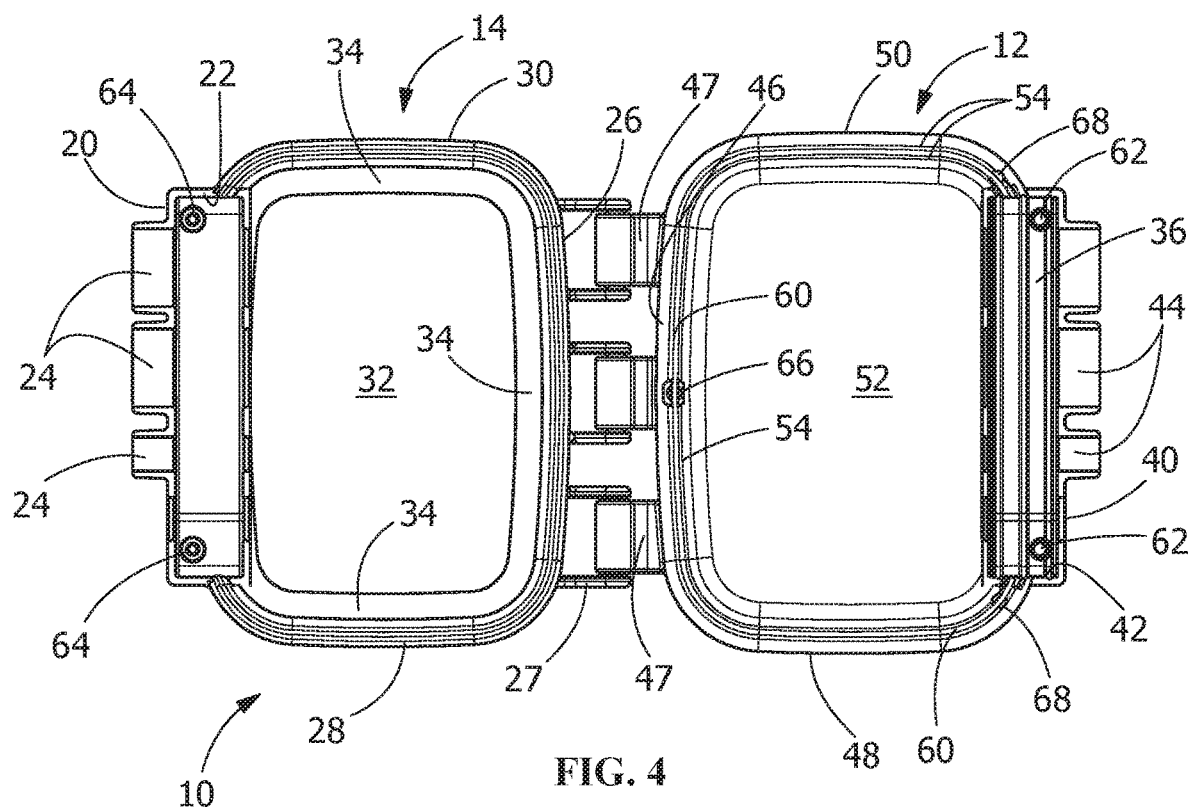
FIG. 4 is a top view of the enclosure device showing the cover portion and the base portion in an open position.

As shown in FIGS. 3 and 4, the base portion 14 has a first or front wall 20 with a seal receiving section 22. The seal receiving section 22 has conductor receiving cavities 24 extending therethrough. A second or rear wall 26 is positioned opposite the front wall 20. Hinge members 27 extend from the rear wall 26. Side walls 28, 30 extend between the front wall 20 and the rear wall 26. In the illustrative embodiment shown, the front wall 20, rear wall 26 and side walls 28, 30 form a rectangular configuration, however, other configurations may be used. The base portion 14 has an opening 32 which is provided on the bottom (as viewed in FIGS. 3 and 4). The opening 32 is open to the electrical component when the enclosure device 10 is positioned on the electrical component.

As shown in FIGS. 3 and 4, a first seal 36 is provided in the seal receiving section 22 of the front wall 20 of the base portion 14. The seal 36 has conductor receiving openings 38 (FIG. 3) for receipt of conductors, such as cables (not shown). Ribs or ridges 39 are provided on the outside edges of the seal 36. The first seal 36 is made from a material, such as, but not limited to rubber, which can deform or compress as the cover portion 12 and base portion 14 are mated together to provide proper sealing.

A first or lower seal receiving channel or recess 34 is provided on the rear wall 26 and side walls 28, 30. The seal receiving recess 34 extends about the periphery of the rear wall 26 and side walls 28, 30 and is open in a direction extending toward the cover portion 12.

The cover portion 12 has a first or front wall 40 with a seal receiving section 42. The seal receiving section 42 has conductor receiving cavities 44 extending therethrough. A second or rear wall 46 is positioned opposite the front wall 40. Hinge members 47 extend from the rear wall 46. Side walls 48, 50 extend between the front wall 40 and the rear wall 46. In the illustrative embodiment shown, the front wall 40, rear wall 46 and side walls 48, 50 form a rectangular configuration, however, other configurations may be used. The cover portion 12 has a top surface 52.

Figure 5:
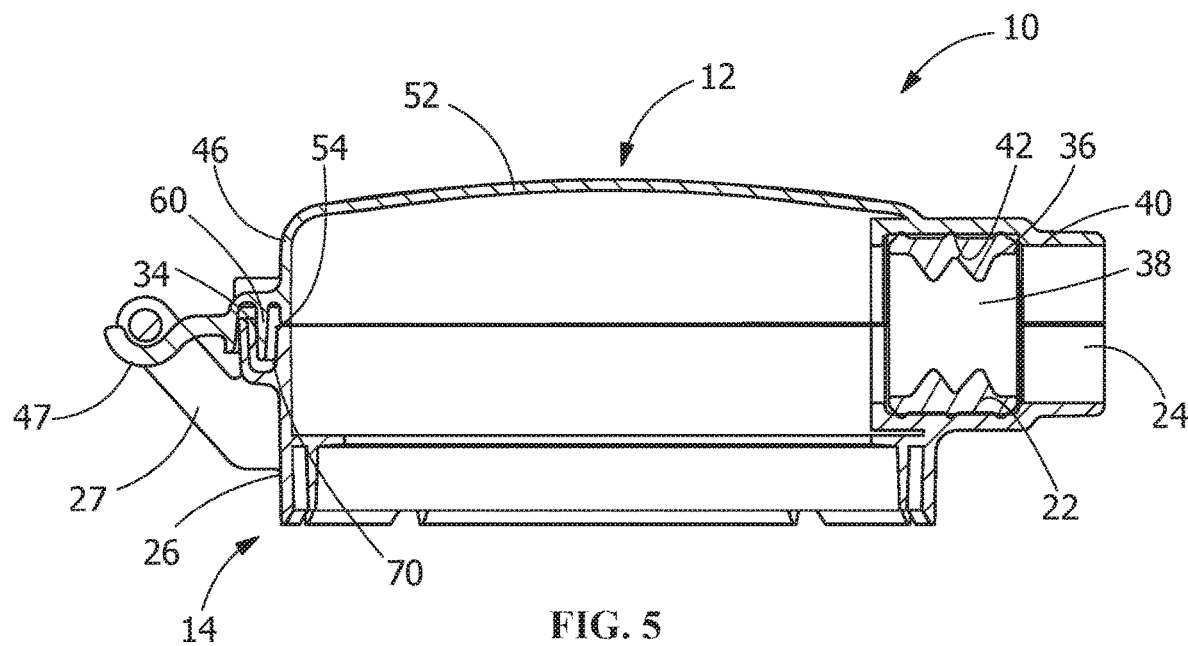
FIG. 5 is a cross-section view of the enclosure device taken along line 5-5 of FIG. 1.
Figure 7:
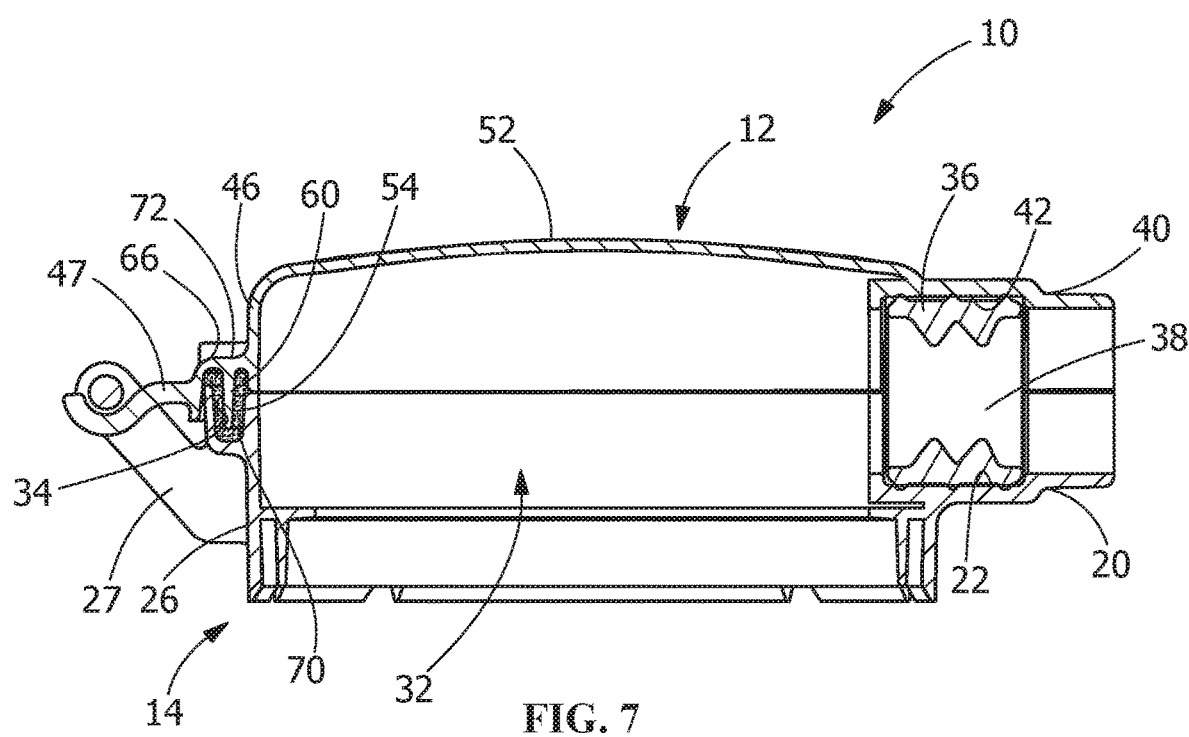
FIG. 7 is a cross-section view of the enclosure device taken along line 7-7 of FIG. 6.

A second or upper seal receiving channel or recess 54 is provided on the rear wall 46 and side walls 48, 50. The seal receiving recess 54 extends about the periphery of the rear wall 46 and side walls 48, 50 and is open in a direction extending toward the base portion 14. A wall or projection 60 extends from the cover portion 12 into the seal receiving recess 54, as shown in FIGS. 5 and 7. The wall 60 provides alignment and an enhanced seal as will be more fully described.

Figure 6:
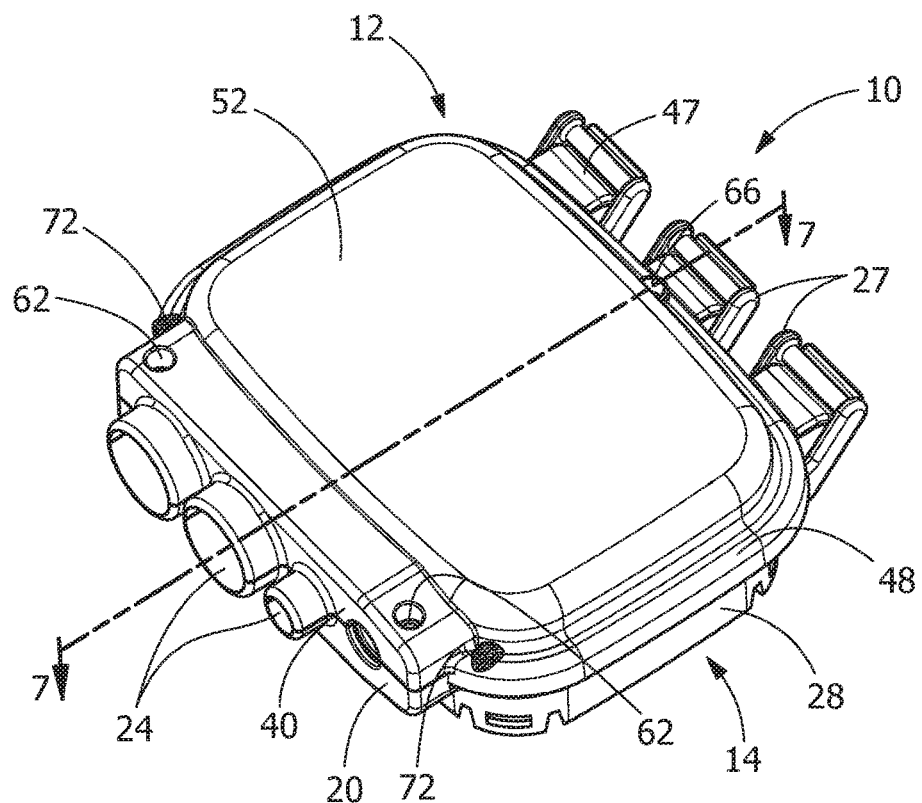
FIG. 6 is a top perspective of the enclosure device of FIG. 1 with sealing gel provided therein.

As shown in FIGS. 1 and 6, mounting openings 62 extend through the cover portion 12 proximate the seal receiving section 42. The mounting openings 62 align with mounting openings 64 provided in the base portion 14 to accept mounting hardware (not shown) to secure the cover portion 12 to the base portion 14 when the enclosure device 10 is fully assembled.

A seal injection or inlet opening 66 is provided in the cover portion 12. In the illustrative embodiment shown, the seal inlet opening 66 is provided proximate the rear wall 46 of the cover portion 12. However, other positions of the seal inlet opening 66 may be used without departing from the scope of the invention. As shown in FIG. 5, the seal inlet opening 66 is provided in line with the upper seal receiving recess 54. The seal inlet opening 66 extends to either side of the wall 60.

Seal exit or outlet openings 68 are provided in the cover portion 12. In the illustrative embodiment shown, the seal outlet openings 68 are provided proximate the front wall 40 and proximate the seal receiving section 42 of the cover portion 12. However, other positions of the seal outlet opening 68 may be used without departing from the scope of the invention. The seal outlet openings 68 are provide in line with the upper seal receiving recess 54. The seal outlet openings 68 extend to either side of the wall 60.

In use, the base portion 14 is assembled or adhered to the electrical component, such as an electrical connector, circuit board or the like. Conductors, such as cables or wires (not shown), are inserted through conductor receiving openings 38 of the seal 36 and are terminated to the electrical component. The seal 36 is positioned in the seal receiving section 22 of the base portion 14 and the conductor are positioned in the conductor receiving cavities 24.

With the conductors properly terminated and the seal 36 properly positioned in the seal receiving section 22 of the base portion 14, the cover portion 12 is rotated about the hinge portion 16 from an open position, as illustrative shown in FIG. 3 or 4, to a closed position, as shown in FIGS. 1, 2 and 5. In the closed position, the seal 36 is positioned in the seal receiving section 42 of the cover portion 12 and the conductor are positioned in the conductor receiving cavities 44. With the cover portion 12 properly positioned on the base portion 14, mounting hardware (not shown) is inserted into the mounting openings 62 of the cover portion 12, the mounting openings 64 of the seal 36 and the mounting openings (not shown) of the base portion 14 to secure the cover portion 12 to the base portion 14.

With the cover portion 12 properly secured to the base portion 14, the lower seal receiving recess 34 and the upper seal receiving recess 54 align to form a combined seal receiving recess 70 which extends about the periphery of the enclosure device 10. With the combined seal receiving recess 70 properly formed a sealant gel 72, FIGS. 6 and 7, is injected into the seal inlet opening 66 of the cover portion 12. The sealant gel 72, may be, but is not limited to, a soft silicone based gel which is designed to conform to its surrounding with minimal force and provide a watertight seal for low voltage (less than 1000 volts) electrical applications.

In an illustrative embodiment, the sealant gel 72 does not require heating or curing, does not flow or leak over time, and is re-enterable or resealable. The sealant gel 72 may be cross linked and cold applied. The thermal resistance of the sealant gel 72 may be half of the thermal resistance of elastomers, thereby minimizing or eliminating interfacial resistance. In addition, illustrative sealant gel 72 may provide a 30-50 degree Celsius reduction in junction temperature when compared to an elastomer pad. The sealant gel 72 provides design flexibility and robustness, as the sealant gel 72 have a 3-5 times higher compressibility versus soft elastomers.

As the sealant gel 72 is injected into the seal inlet opening 66, the sealant gel 72 if forced into the combined seal receiving recess 70. As this occurs, the sealant gel 72 flows around the projection 60, thereby providing an increased surface area for the sealant gel 72 to engage and seal to the projection 60. Continued injection of the sealant gel 72 forces the sealant gel 72 to flow through the combined seal receiving recess 70 to the seal outlet openings 68 (FIG. 1), which may cause the sealant gel 72 to flow out of the seal outlet opening, as represented by the sealant get 72 shown in FIG. 6. In addition, the sealant gel 72 may be forced into between the ridges 39 of the seal 36.

Injection of the sealant gel 72 is stopped once sealant gel 72 is visible or extend from each of the seal outlet openings 68. The seal outlet openings 68 provide an exit or outlet for the sealant gel 72, thereby allowing the sealant gel 72 to flow easily through the combined seal receiving recess 70 without encountering pressure build up or the like. In addition, the flow of the sealant gel 72 from the seal outlet openings 68 provides a visible indication to the operator that the combined seal receiving recess 70 is fully filled and that the sealant gel 72 has provided a proper seal between the cover portion 12 and the base portion 14.

The use of the lower seal receiving recess or channel 34 on the base portion 14 and the upper seal receiving recess or channel 54 on the cover portion 12 to form the combined seal receiving recess or channel 70 allows for the cover portions 12 to be mated to the base portion 14 even if there are small tolerance inconsistencies or positional irregularities. The projection 60 is positioned within the lower seal receiving recess or channel 34 on the base portion 14 to properly align the cover portion 12 with the base portion 14. However, as the projection 60 can be provided anywhere within the lower seal receiving recess or channel 34, precise alignment of the cover portion 12 with the base portion 14 is not required. The injection of the sealant gel 72 into the combined seal receiving recess or channel 70 provides proper sealing of between the cover portion 12 and the base portion 14 regardless of the positioning of the of the projection 60 in the lower seal receiving recess or channel 34. In addition, the use of the sealant gel 72 into the combined seal receiving recess or channel 70 allows for the serviceability of the electrical component, as the cover portion 14 may be opened and reused by refilling the combined seal receiving recess or channel 70 with additional sealant gel 72.

While the invention has been described with reference to a preferred embodiment, it will be understood by those skilled in the art that various changes may be made and equivalents may be substituted for elements thereof without departing from the spirit and scope of the invention as defined in the accompanying claims. One skilled in the art will appreciate that the invention may be used with many modifications of structure, arrangement, proportions, sizes, materials and components and otherwise used in the practice of the invention, which are particularly adapted to specific environments and operative requirements without departing from the principles of the present invention. The presently disclosed embodiments are therefore to be considered in all respects as illustrative and not restrictive, the scope of the invention being defined by the appended claims, and not limited to the foregoing description or embodiments.

I claim:

1. An enclosure for an electrical component comprising:
    a base portion having a first channel which extends about at least a portion of a periphery of the base portion;
    a cover portion having a second channel which extends about at least a portion of a periphery of the cover portion, the second channel is aligned with the first channel to form a sealant receiving channel, the second channel having a projection which extends into the first channel;
    a sealant provided in the sealant receiving channel;
    the cover portion having at least one inlet opening, the at least one inlet opening extending from a top surface of the cover portion to the second channel of the cover portion, the at least one inlet opening configured to receive the sealant as the sealant is injected into the sealant receiving channel, the at least one inlet opening provided in line with the second channel and extending to either side of the projection;
    the cover portion having at least one outlet opening, the at least one outlet opening spaced from the at least one inlet opening and extending from a top surface of the cover portion to the second channel of the cover portion, the at least one outlet opening configured to allow excess sealant of the sealant to escape from the sealant receiving channel as the sealant is injected into the sealant receiving channel.

2. The enclosure as recited in claim 1, wherein a hinge portion is provided to allow the cover portion to move between an open position and a closed position relative to the base portion.

3. The enclosure as recited in claim 2, wherein the base portion has a base portion front wall with a base portion seal receiving section, the base portion seal receiving section has base portion conductor receiving cavities extending therethrough.

4. The enclosure as recited in claim 3, wherein the base portion has a base portion rear wall positioned opposite the base portion front wall, base portion hinge members of the hinge portion extend from the base portion rear wall.

5. The enclosure as recited in claim 3, wherein a first seal is provided in the first seal receiving section of the front wall of the base portion, the first seal has conductor receiving openings, ribs are provided on outside edges of the first seal.

6. The enclosure as recited in claim 2, wherein the cover portion has a cover portion front wall with a cover portion seal receiving section, the cover portion seal receiving section has cover portion conductor receiving cavities extending therethrough.

7. The enclosure as recited in claim 6, wherein the cover portion has a cover portion rear wall positioned opposite the cover portion front wall, cover portion hinge members of the hinge portion extend from the cover portion rear wall.

8. The enclosure as recited in claim 1, wherein the base portion has an opening which is provided on a bottom wall, the opening is open to the electrical component when the enclosure is positioned on the electrical component.

9. The enclosure as recited in claim 1, wherein the first channel of the base portion is open in a direction extending toward the cover portion.

10. The enclosure as recited in claim 1, wherein the second channel of the cover portion is open in a direction extending toward the base portion.

11. The enclosure as recited in claim 1, wherein the at least one inlet opening is provided proximate a cover rear wall.

12. The enclosure as recited in claim 1, wherein the at least one outlet opening is provided proximate a cover portion front wall and proximate a cover portion seal receiving section.

13. The enclosure as recited in claim 12, wherein the at least one outlet opening is provided in line with the second channel and extends to either side of the projection.

14. The enclosure as recited in claim 1, wherein the sealant is silicone based gel which conforms to the sealant receiving channel provide a watertight seal.

* * * * *